United States Patent [19]
DiStefano et al.

[11] Patent Number: 5,859,472
[45] Date of Patent: Jan. 12, 1999

[54] CURVED LEAD CONFIGURATIONS

[75] Inventors: Thomas H. DiStefano, Monte Sereno; John W. Smith, Palo Alto, both of Calif.

[73] Assignee: Tessera, Inc., San Jose, Calif.

[21] Appl. No.: 927,601

[22] Filed: Sep. 12, 1997

Related U.S. Application Data

[60] Provisional application No. 60/026,013 Sep. 12, 1996.

[51] Int. Cl.$^6$ .............................. H01L 23/48; H01L 29/06
[52] U.S. Cl. .......................... 257/674; 257/666; 257/690; 257/642; 257/773
[58] Field of Search .................................. 257/666, 674, 257/690, 642, 643, 700, 773

[56] References Cited

U.S. PATENT DOCUMENTS

| | | | |
|---|---|---|---|
| 3,795,037 | 3/1974 | Luttmer | 29/628 |
| 4,893,172 | 1/1990 | Matsumoto et al. | 257/668 |
| 5,518,964 | 5/1996 | Distefano et al. | 437/209 |
| 5,682,061 | 10/1997 | Khandros et al. | 257/666 |
| 5,763,941 | 6/1998 | Fjelstad | 257/669 |

*Primary Examiner*—Peter Toby Brown
*Assistant Examiner*—Hung Van Duong
*Attorney, Agent, or Firm*—Lerner, David, Littenberg, Krumholz & Mentlik

[57] ABSTRACT

A microelectronic assembly includes first and second microelectronic elements having confronting surfaces that are spaced apart from one another. Vertically extensive flexible lead elements interconnect electrical connections on the microelectronic elements. Each of the flexible lead elements may include a plurality of curved conductors that are electrically connected and parallel to one another. The lead elements may initially be formed on a lead bearing surface, and have a terminal end for connection to the first microelectronic element, and a tip end for connection to the second microelectronic element. The terminal end is disposed on the lead bearing surface and fixed to it, while the tip end is releasably connected to the lead bearing surface, and spaced apart from the terminal end on an offset axis. Curved leads interconnect the tip end and the terminal end.

40 Claims, 6 Drawing Sheets

CURVED LEAD CONFIGURATIONS

The present application claims benefit of U.S. Provisional Application No. 60/026,013, filed Sep. 12, 1996, the disclosure of which is hereby incorporated by reference herein.

FIELD OF THE INVENTION

The present invention relates to mounting and connection devices for use with microelectronic elements such as semiconductor chips.

BACKGROUND OF THE INVENTION

Complex microelectronic devices such as modern semiconductor chips require numerous connections to other electronic components. For example, a complex microprocessor chip may require hundreds of connections to external devices.

Semiconductor chips have commonly been connected to electrical traces on mounting substrates using several alternative methods, including wire bonding, tape automated bonding and flip-chip bonding. Each of these techniques presents various problems including difficulty in testing the chip after bonding, long lead lengths, large areas occupied by the chip on the microelectronic assembly, and fatigue of the connections due to changes in the sizes of the chip and the substrate under thermal expansion and contraction.

Structures that have been used to successfully address the foregoing problems are disclosed in commonly assigned U.S. Pat. Nos. 5,148,265; 5,148,266; and 5,455,390. Structures according to certain of the embodiments taught in those patents comprise a flexible, sheet-like element having a plurality of terminals disposed thereon. Flexible leads are used to connect the terminals with contacts on a first microelectronic element such as an integrated circuit. The terminals may then be used to test the microelectronic chip, and may be subsequently bonded to a second microelectronic element. The flexible leads permit thermal expansion of various components without inducing stresses in the connection.

Commonly assigned U.S. Pat. No. 5,518,964 ("the '964 patent"), hereby incorporated in its entirety herein, discloses further improvements in microelectronic connections. In certain embodiments of the '964 patent, a flexible, sheet-like element has a first surface with a plurality of elongated, flexible leads extending from a terminal end attached to the sheet-like element to a tip end offset from the terminal end in a preselected, first horizontal direction parallel to the sheet-like element. The tip ends have bond pads for connection to a microelectronic element. As the term is used herein, "microelectronic element" encompasses circuit boards, integrated circuits, connection components such as polyimide or other dielectric sheets, and other components used in microelectronic circuitry. Each of the plurality of leads is simultaneously formed by moving all of the tip ends of the leads relative to the terminal ends thereof so as to bend the tip ends away from the sheet-like element. This is accomplished by relative movement between the sheet-like element and the microelectronic element.

The tip ends of the leads are initially attached to the sheet-like element. The initial position of the bond pad on the tip ends is thereby fixed with respect to the terminal ends in order to facilitate attachment to the microelectronic element.

Various lead configurations are disclosed in the '964 patent. In one such configuration, the leads comprise straight, elongated bodies of conductive material extending between terminal ends connected to a dielectric sheet-like element and tip ends to be connected to a microelectronic element. The terminal end of the lead is attached through a via in the sheet-like element to another microelectronic element on the other side of the sheet-like element. The attachment of the tip ends of the leads to the sheet-like element is releasable. After bonding the tip ends to the microelectronic element, the leads are formed in their final configuration by moving the sheet-like element and the microelectronic elements relative to each other in two directions: in a vertical direction away from each other, and in a horizontal direction parallel to the sheet-like element. As a result, the tip end of the lead is separated from the sheet-like element and traces an arcuate path relative to the other end of the lead. That movement prevents stretching of the lead during formation and results in an S-shaped configuration of the lead that is advantageous in absorbing further relative movement between the sheet-like element and the microelectronic element due to thermal expansion/contraction during operation of the resulting device.

In another lead configuration taught in the '964 patent, the lead is initially a curved strip disposed on a surface of the sheet-like element. A terminal end of the lead is connected to a terminal through a via in the sheet-like element and a tip end is bonded to a microelectronic element. In forming those leads to a final configuration, the sheet-like element and the microelectronic element are moved away from each other in a vertical direction only. The curve of the lead is partially straightened by the relative movement of the elements. The "slack" created by the initial curve in the lead permits vertical displacement of the microelectronic components without the necessity of providing additional lead length by horizontally displacing the components.

A number of such configurations are disclosed in the '964 patent. An S-shaped lead structure having two small, opposite bends in each lead permits nesting of adjacent leads in configurations requiring a high lead density. A U-shaped lead configuration permits larger relative displacement of the microelectronic components in a vertical direction without a corresponding horizontal displacement. Other such configurations are also disclosed.

Commonly assigned U.S. patent application Ser. No. 08/712,855, filed Sep. 12, 1996, which is incorporated by reference in its entirety herein, discloses additional lead configurations. One lead disclosed in that application comprises a body section and two flexible leg sections separated by a single slot. The ends of the leg sections comprise tip and terminal ends. The slot has a cutout at its end to reduce stress concentration.

There is presently a need for a curved lead configuration that performs several important functions. First, the lead should be capable of extending a sufficient vertical distance out of the original plane of the lead in order to allow relative movement of the two microelectronic components. While larger leads inherently extend further than smaller leads, the pitch of the lead array should also be small enough to match the pitch of the contacts of the microelectronic component. It is therefore desirable that the extension as a percent of the pitch of a corresponding grid array be maximized.

In some instances, stress at a given point in the lead may be increased by concentrated torsion or bending forces resulting from the particular lead geometry. The stress undergone by the lead during extension should therefore be minimized by providing rounded corners where possible and by minimizing strain caused by twisting and bending during extension. A large, concentrated stress in the lead during extension could result in failure of the lead in service by exceeding the ultimate tensile strength of the material or by exceeding the fatigue limit.

The lead should also be simple in geometry. While current photolithographic techniques permit relatively high resolution, certain complex shapes at extremely small pitches may be beyond the capability of present manufacturing processes. If possible, a curved lead design should therefore incorporate a minimum of geometric features, and the function of the lead should not rely on fine detail.

The lead may be releasably attached to the lead bearing surface for substantially its entire length, as described in commonly assigned U.S. patent application Ser. No. 08/547, 170 filed Oct. 24, 1995, which is hereby incorporated by reference in its entirety herein. The peel stress undergone by such a lead during separation of the microelectronic elements from the lead-bearing surface should be minimized. As the lead is pulled from the surface, a tensile force is exerted on the portions of the lead already freed from the surface. Peel stress may be excessively high when a portion of a lead having a relatively small cross-section must be subjected to tension sufficient to peel a relatively large area of the lead from the surface.

Finally, any lead configuration has some amount of self-inductance, limiting the speed with which that lead can reliably convey an electrical signal. Certain lead configurations, however, may limit that inherent inductance through geometries that create opposing or canceling magnetic fields, thereby reducing resistance to changes in current flow. For example, it is believed that parallel conductors in close proximity tend to cancel corresponding magnetic fields, thus reducing the self-inductance of the overall lead.

Still further improvements in the above-described lead configurations would be desirable.

SUMMARY OF THE INVENTION

In one embodiment of the invention, a microelectronic lead assembly for connecting first and second microelectronic elements comprises a structure defining a lead bearing surface, a terminal end for connection to the first microelectronic element, and a tip end for connection to the second microelectronic element. The terminal end is disposed on the lead bearing surface and fixed to the surface-defining structure. The tip end is releasably connected to the lead bearing surface and spaced apart on the lead bearing surface from the terminal end on an offset axis. The lead assembly further comprises a first curved lead interconnecting the tip end and the terminal end, and a second curved lead interconnecting the tip end and the terminal end. By providing two separate leads for interconnecting the microelectronic elements, reliability is increased through the use of redundant conductors, and inductance is reduced by the cancellation of parallel magnetic fields.

The two curved leads may be arranged on opposite sides of the offset axis, and may further be substantially symmetric across the offset axis. The two leads may join the terminal end from substantially opposite directions, and may further join the tip end from substantially opposite directions.

The curved leads may bow away from the offset axis and away from one another between the tip end and the terminal end. The terminal end may include a bulge, and the first and second curved leads may have tapered portions adjacent to the terminal end, wherein the leads gradually increase in width in directions along the curved leads toward the terminal end. The structure defining the lead bearing surface may be a flexible, sheet-like structure, and the terminal end of the lead may be fixed to a via extending through that structure.

In another embodiment of the invention, the above-described microelectronic lead assembly having first and second curved leads interconnecting the tip and terminal ends may further have an extension portion extending substantially along the offset axis and connected at one end to one of the tip and terminal ends, and connected at the other end to the first and second curved leads. The extension portion provides some additional vertical extension of the lead as a percentage of the grid.

The extension portion may extend from one of the ends in a direction away from the other of the ends and may extend from the terminal end. The structure defining the lead bearing surface may be a flexible, sheet-like structure, and the terminal end may be fixed to a via extending through the structure.

In another embodiment of the invention, a microelectronic lead assembly has a structure defining a lead bearing surface, a terminal end on the lead bearing surface and fixed to the structure, and a tip end releasably connected to the lead bearing surface, and spaced apart from the terminal end. The terminal end is for connection to a first microelectronic element, and the tip end is for connection to a second microelectronic element. A curved lead connects the tip end and the terminal end. The curved lead has a bulge at one of the ends, with the lead being substantially tangent to the bulge.

Such a lead provides a large amount of extension in comparison to the grid area occupied by the lead, because the lead has a comparatively small overall size in the plane of the lead-bearing surface, while having a relatively long length.

In one version of that embodiment, the ends define a lead offset axis, and the point of tangency between the lead and the bulge lies substantially on that axis. The point of tangency may further be on the side of the bulge facing the other end of the lead. The bulge may be on the terminal end of the lead assembly.

A major portion of the lead may be a U-shaped bight on one side of the offset axis. The structure defining the lead bearing surface may be a flexible, sheet-like structure, in which case the terminal ends are fixed to vias extending through the structure.

Another aspect of the invention provides a microelectronic lead assembly having a structure defining a lead bearing surface, with tip and terminal ends disposed thereon, as above. A generally S-shaped lead connects the tip and terminal ends. The curved lead has a first curve in a first direction and a second curve in a second direction opposite the first direction. The first curve further has a curve angle of at least 90 degrees as measured by an angle that a vector tangent to the lead entering the curve must be rotated to have a direction of a vector tangent to the lead exiting the curve.

In that embodiment of the invention, the second curve may also have a curve angle of at least 90 degrees. The structure defining the lead bearing surface may be a flexible, sheet-like structure, with the terminal ends fixed to vias extending through the structure.

In another aspect of the invention, the microelectronic lead assembly comprises a structure defining a lead bearing surface, a tip end for connecting to the second microelectronic element, and an annular terminal structure for connecting to the first microelectronic element. The tip end is releasably connected to the lead bearing surface, while the terminal structure is disposed on the lead bearing surface surrounding and substantially concentric with the tip end, and fixed to the structure. A plurality of leads interconnect the tip end and the annular terminal structure. Such a configuration has a very low inductance and high reliability due to the plurality of conductors interconnecting the two ends of the lead assembly.

The plurality of leads in this embodiment may comprise elongated, spiral leads. There may be three such leads. The structure defining the lead bearing surface may be a flexible, sheet-like structure, with the terminal end of the lead fixed to a via extending through the structure.

In another embodiment of the invention, the microelectronic lead assembly comprises a structure defining a lead bearing surface, a terminal end for connection to a first microelectronic element, and a tip end for connection to the second microelectronic element. The terminal end is disposed on the lead bearing surface and is fixed to the structure, while the tip is releasably connected to the lead bearing surface. A sheet-like lead interconnects the tip end and the terminal end. The sheet-like lead has a peripheral edge, and defines a slot with a plurality of branches. A first one of the branches passes between the tip end and the terminal end, and has an opening at the peripheral edge.

The slot defined by the sheet-like lead may be generally Y-shaped, having second and third branches joining the first branch at a junction. The sheet-like element may comprise an elongated portion extending from a bulbous portion. In that case, the slot has a second branch extending longitudinally along a portion of the elongated portion.

One of the tip end and the terminal end may be positioned at a center of the bulbous portion, and the other of the tip end and terminal end may be positioned at a peripheral portion of a bulbous portion. The slot may further have a third branch connected to the first and second branches near where the elongated portion joins the bulbous portion. In that embodiment, the first and third branches extend within the bulbous portion, partially around the center. At least one of the plurality of branches may have a rounded cutout at its end for stress relief. The bulbous portion may have a clearance cutout for clearing an elongated portion of a neighboring lead.

In another embodiment of the invention, a microelectronic assembly includes first and second microelectronic elements having confronting surfaces spaced away from one another in a vertical direction. A plurality of electrical connections on the microelectronic elements are interconnected by a plurality of vertically extensible flexible lead assemblies. Each of the flexible lead assemblies includes a plurality of curved conductors electrically connected in parallel with one another.

The electrical connections may be arranged in a grid array, and may have a pitch of less than about 0.25 mm. The plurality of curved conductors in each flexible lead assembly may comprise a pair of leads and may be arranged symmetrically about an axis. A compliant layer may be interposed between the confronting surfaces, surrounding the flexible lead assemblies.

These and other objects, features and advantages of the present invention will be more readily apparent from the detailed description of the preferred embodiment set forth below, taken in conjunction with the accompanying drawings.

DETAILED DESCRIPTION OF THE PREFERRED EMBODIMENTS

The present invention provides leads for interconnecting microelectronic components, while permitting those components to move relative to each other. The leads optimize various combinations of low inductance, redundancy, increased length of extension and/or improved strength. Individual lead elements have terminal ends permanently attached to a structure forming a lead bearing structure, tip ends that are removably attached to the lead bearing surface, and curved leads connecting the two. The leads may be extended by separating the microelectronic components connected to the tip and terminal ends.

A microelectronic lead assembly 10 according to the invention (FIG. 1) includes a structure 11 defining a lead bearing surface 12. On the lead bearing surface are one or more lead elements 15, each lead element having a terminal end 16 and a tip end 17. The terminal end 16 is fixed to the structure 11, and is disposed on the lead bearing surface 12. The tip end 17 is releasably connected to the lead bearing surface 12, and is spaced apart from the terminal end. The terminal end 16 is for connection to a first microelectronic element, which may be the structure 11; the tip end is for connection to a second microelectronic element.

Figure 1:
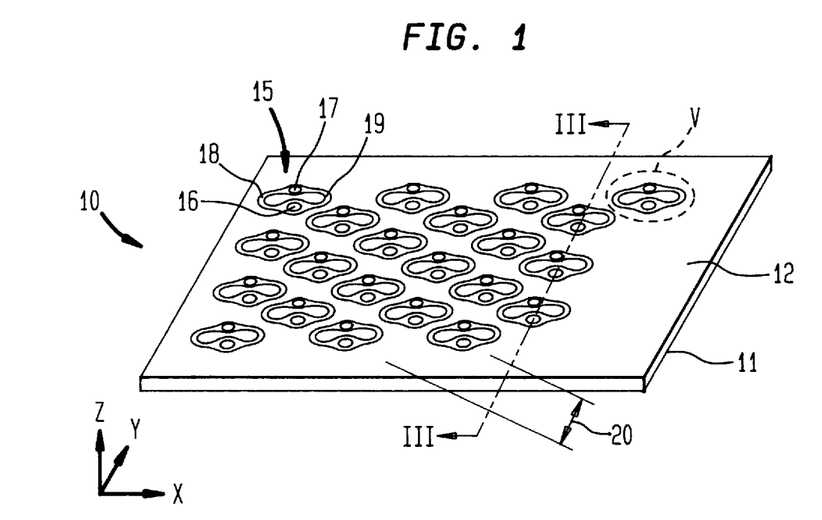
FIG. 1 is a perspective view of a microelectronic lead assembly according to one embodiment of the invention.

The tip end 17 may be releasably connected to the lead bearing surface 12 by a button (not shown) joining the underside of the lead to the lead-bearing surface in the area of the tip end, as discussed in the '964 patent. In that case, the lead is not attached to the lead bearing surface between the tip and terminal ends, and the tip end is maintained in position for bonding by the button. Alternatively, substantially the entire lead is releasably attached to the lead bearing surface. In that case, the lead must be peeled from the lead bearing surface during relative movement of the first and second microelectronic elements, as described below.

The terminal end 16 and tip end 17 are interconnected by a first curved lead 18 and by a second curved lead 19. Thus, the two curved leads are electrically in parallel connecting the tip and terminal ends.

The lead elements 15 are arranged on the lead bearing surface 12 in a grid array having a pitch 20. The pitch of the grid array as used herein is defined as the center-to-center distance between two adjacent rows of lead elements. Where the lead elements are arranged in alternating, offset rows as in FIG. 1, the pitch is in a diagonal direction. The pitch of lead elements arranged on the lead bearing surface 12 corresponds to the pitch of a grid array of conductors, such as microprocessor contacts, to which the tip ends 17 of the lead elements must attach. Standard microprocessor terminal arrays have standard pitches of about 0.75 mm or less. The lead elements of the present invention may also be used for attachment to any contact grid pitch, even contact grid pitches of 0.5 mm or less.

The lead elements 15 may be formed from a ductile material such as gold, copper or nickel, or may be formed by deposition or lamination of various layers of those materials. Preferably, the lead element is deposited on or laminated to the lead bearing surface 12, using deposition and/or etching techniques as are known in the art. The lead may alternatively be formed as part of a microelectronic circuit board or formed directly on another microelectronic element.

Figure 2:
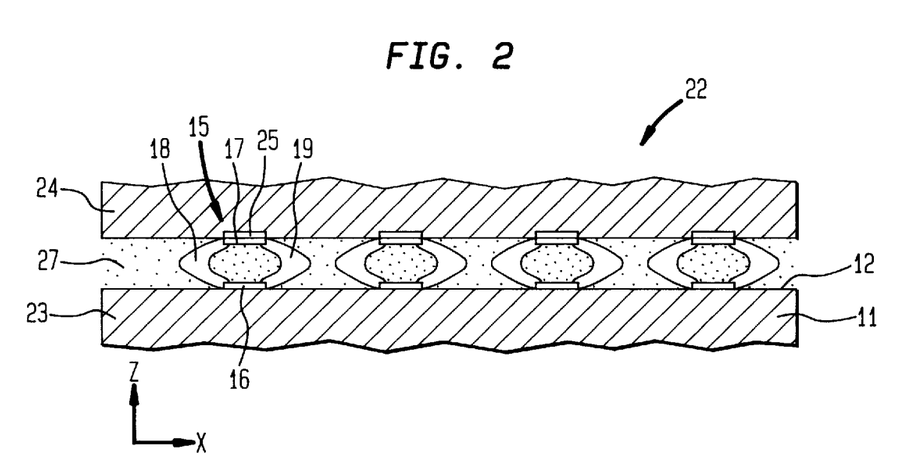
FIG. 2 is a partial cross-sectional view of a microelectronic assembly of the invention including a plurality of extended lead elements.

A microelectronic assembly 22 (FIG. 2) according to the invention is formed by bonding the tip end 17 of each lead element of a microelectronic lead assembly to corresponding contacts 25 on a second microelectronic component 24, such as a microprocessor. The tip ends 17 of the lead element may be bonded by activating bonding material in a bonding button 35 (see FIG. 3) disposed on the tip end for that purpose.

The terminal ends 16 of the lead elements 15 are connected to a first microelectronic component 23. In the embodiment shown in FIG. 2, the microelectronic element 23 is also the structure 11 defining the lead bearing surface 12.

One suitable bonding material for use in forming a bond between the tip ends of the leads and the respective aligned contacts on the opposing microelectronic elements is a gold-tin eutectic bond comprising a layer of tin about 10 microns thick and a gold anti-oxidant layer approximately 2 microns thick over the tin layer. Other bonding materials, such as lead-tin eutectic bonding material or conductive, silver-filled epoxy may be used, among others.

After bonding the tip ends 17 to contacts on the second microelectronic element, the second microelectronic element is displaced in a direction away from the lead bearing surface 12. The lead elements 15 deform to span the gap between the lead bearing surface 12 and the microelectronic element 24. In the case of the lead elements 15, first curved lead 18 and second curved lead 19 each twist and bend in opposite directions to form mirror image, electrically parallel connections.

In one embodiment of the invention, the microelectronic elements are separated by injecting a liquid or gas between the lead bearing surface 12 and the second microelectronic element 24, forcing the microelectronic elements away from each other and bending the leads. In a preferred embodiment, a curable, liquid encapsulant 27 (FIGS. 2, 4), such as silicone or a flexiblized epoxy, is introduced between the facing surfaces, separating the microelectronic elements, deforming the lead elements and forming a compliant layer of encapsulant between the microelectronic elements after the layer has been cured. The liquid encapsulant may be injected under pressure, or may be allowed to flow into an evacuated space between the microelectronic elements, or may be both pressurized and introduced into an evacuated space. The compliant layer seals the region between the microelectronic elements from contaminants and reduces stresses induced by relative movement of the microelectronic components 23, 24 that would otherwise be transferred to the lead elements 15. In the case where the first microelectronic 23 comprises a flexible sheet such as a polyimide sheet or other dielectric sheet (FIGS. 3, 4), the compliant layer further provides a conformable backing for the dielectric sheet. The flexibility may compensate for height and flatness errors that would otherwise adversely effect the later bonding of terminals on the second side 38 of the dielectric layer to a microelectronic component.

Alternatively, compliant material 27 may be injected between the components after the components are separated, and after the leads are deformed.

In the embodiment wherein the structure 11 defining the lead bearing surface 12 is a flexible, sheet-like dielectric structure 30 (FIG. 3), the lead elements 15 are attached to vias 32 passing through holes 31 in the dielectric sheet. A bonding material 35 is provided on the tip end 17 for connection to a second microelectronic element. The vias 32 provide electrical continuity between the terminal end 16 of the lead element 15 and the lower surface 38 of the polyimide sheet 30.

A microelectronic assembly 45 (FIG. 4) including a dielectric sheet 30, lead elements 15 and a second microelectronic component 24 may later be connected to a circuit board 41 or other substrate. For example, the terminals 33 formed by the lower ends of the vias 32 may be superimposed with a grid array of solder balls 42 formed on the contacts of the substrate. The curved, flexible lead elements 15, in combination with the compliant layer 27, permit the polyimide sheet 30 to flex, compensating for non-planarity of the solder ball array 42 and the via terminals 33, thus making better electrical contact between those elements.

Figure 3:
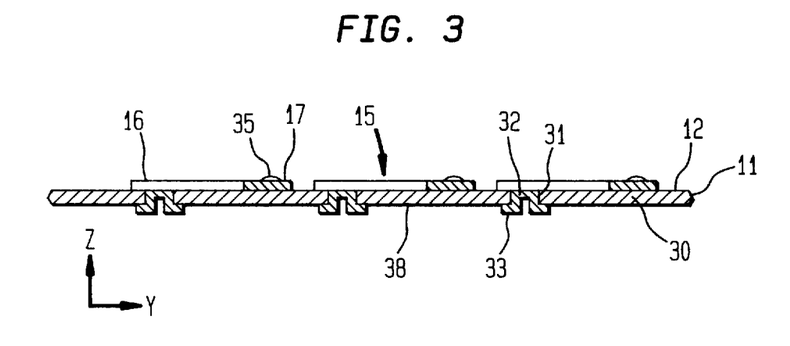
FIG. 3 is a cross-sectional view of the microelectronic lead assembly of FIG. 1 through line III—III.
Figure 4:
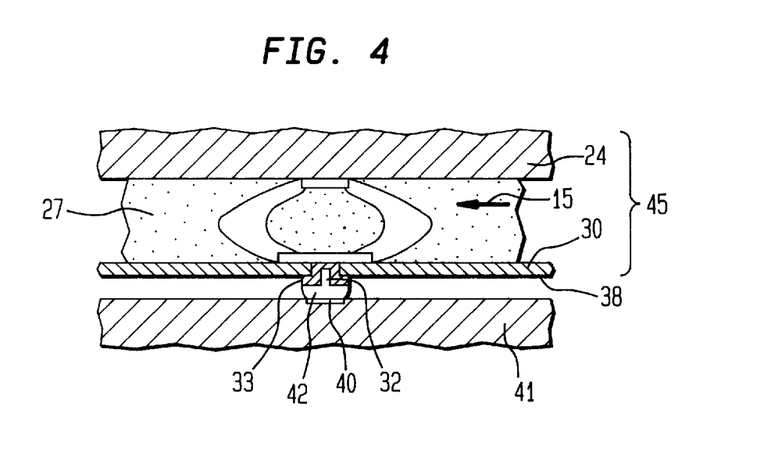
FIG. 4 is a microelectronic assembly including the microelectronic lead assembly of claim 3, showing a connection to a substrate.

A single lead element 15 of the invention (FIG. 5) comprises an enlarged terminal end 16 and an enlarged tip end 17 interconnected by first curved lead 18 and second curved lead 19. The terminal end 16 comprises a bulge in the lead element surrounding a connection 46 to the underlying structure defining the lead bearing surface 12. The connection 46 mechanically connects the lead element 15 to the underlying structure, and electrically connects the lead element to a first microelectronic component. In a preferred embodiment, connection 46 is a via 32 (FIG. 3). The tip end 17 of the lead element 15 is defined by another bulge surrounding the bonding button 35. As noted above, the bonding button is formed of a conductive, activatable bonding material for forming a bond with a second microelectronic element.

Figure 5:
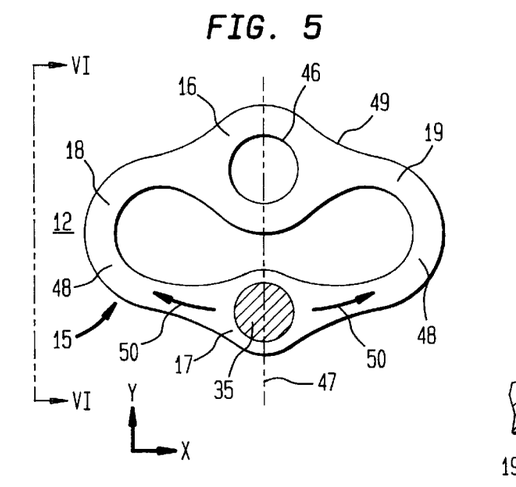
FIG. 5 is a plan view of a lead element of FIG. 1 showing the region in circle V.

The tip end 17 and terminal end 16 are offset from each other along an offset axis 47 on the lead bearing surface 12.

Figure 6:
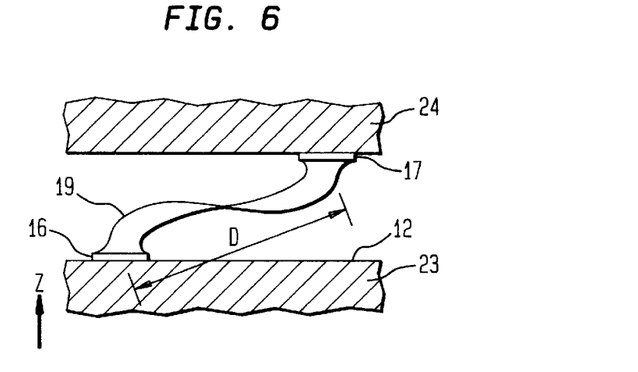
FIG. 6 is an idealized side view of the lead element of FIG. 5, in a direction of arrow VI—VI, shown in an expanded state.

In a preferred embodiment, the tip and terminal ends are spaced apart less than approximately 400 microns, and most preferably are spaced apart about 200 microns. The first and second curved leads 18, 19 are arranged on opposite sides of the offset axis 47, and the axis 47 forms an axis of symmetry between the two leads. The curved leads extend from the tip and terminal ends in a direction away from the offset axis, in substantially opposite directions. Each of the first and second curved leads 18, 19 comprise a bow region 48 in which the leads substantially reverse direction. In the transitional areas 49 between the bulges at the tip and terminal ends and the curved leads, generous fillet radii are provided to reduce stress in the lead elements that may be induced by bending and twisting that occurs as the leads are expanded in the vertical, or Z direction (FIG. 6).

As the first and second microelectronic elements 23, 24 are separated from each other in the Z direction, the curved leads 18, 19 accommodate the relative motion of the tip and terminal ends by bending and twisting. The particular geometry of the curved lead elements 18, 19 permits the leads to conform to relative displacement of the tip and terminal ends in the Z direction without requiring displacement in the X or Y directions. During separation of the tip and terminal ends in the Z direction, the bow regions 48 of the leads are drawn closer to the offset axis 47, compensating for the increased straight-line distance D (FIG. 6) between the tip and terminal ends after expansion of the leads.

The lead element 15 has particularly low self-inductance due to the parallel conductors formed by the first and second leads 18, 19. It is believed that magnetic fields generated by those leads partially cancel each other, reducing the inductance of the lead element as a whole, and reducing the associated lag time for current changes.

The lead element 15 is capable of extending approximately 80% of the pitch of a corresponding grid array. Stated another way, the leads of the lead element 15 may be expanded in the Z direction approximately 80% of the X-Y distance between adjacent rows of a grid array comprising those lead elements.

The dual curved leads 18, 19 provide redundant conductors for carrying signals between the tip end and the terminal end. Thus, failure of one of the curved leads does not result in the failure of the lead element as a whole.

The curved leads of the lead element 15 have large radii of curvature, and the transition areas 49 have generous stress-reducing fillet radii. Thus, stress risers are minimized and the lead is believed to have a high ultimate strength and fatigue life.

During separation of the first and second microelectronic components 23, 24, the lead element 15 in certain embodiments is "peeled" from the lead bearing surface 12. This occurs in those embodiments where the lead element 15 is releasably adhered long its length to the lead-bearing surface 12. In expanding the lead element 15, the curved leads 18, 19 are peeled in a direction of arrows 50. Because the cross-sectional area of each lead 18, 19 is relatively constant as it is peeled from the lead bearing surface 12, no undue stresses are created in the leads during the peeling process.

In another embodiment of the invention, the lead element 60 (FIG. 7) is disposed on a lead bearing surface 12. The lead has a terminal end 76 for connection to a first microelectronic element. The terminal end is fixed to the structure defining the lead bearing surface 12. The lead element 60 further has a tip end 77 for connection to a second microelectronic element. The tip end is provided with a solder bump or means for bonding to a contact on the second microelectronic element. In a preferred embodiment, the tip and terminal ends are spaced apart from one another less than approximately 400 microns, and most preferably are spaced apart about 200 microns.

Figure 7:
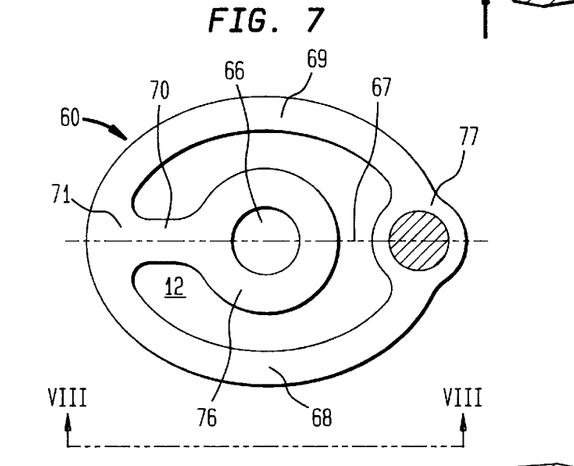
FIG. 7 is a plan view of a lead element according to another embodiment of the invention.

The lead element 60 further comprises first and second curved leads 68, 69 interconnecting tip end 77 and the terminal end 76. While the curved leads 68, 69 extend directly from the tip end 77, the curved leads are connected to the terminal end 76 through an extension portion 70 that extends from the terminal end to a junction 71 of the two curved leads.

Generous fillet radii are provided between the leads 68, 69, the extension 70 and the bulges defining the tip and terminal ends 77, 76. Those radii reduce stress concentrations in the lead element 60 during extension in the Z direction.

The extension portion 70 extends along an offset axis 67 intersecting the centers of the tip and terminal ends. The extension portion 70 may extend from the terminal end 76 as shown, or may extend from the tip end 77. It is preferred that the extension portion extend from the terminal end so that the dual lead portion is peeled from the lead-bearing surface first, reducing peel stress in the extension portion.

Figure 8:
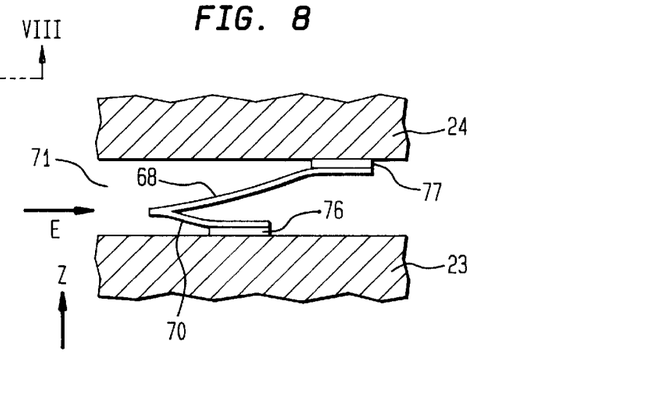
FIG. 8 is an idealized side view of the lead element of FIG. 7, in the direction of arrow VIII—VIII, shown in an expanded state.

In either case, it is preferred that the extension portion extend from the respective end in a direction away from the other end. Such an arrangement reduces twisting in the lead as the first and second microelectronic components 23, 24 are separated in the Z direction (FIG. 8). As the tip end 77 and terminal end 76 are separated, the joint area 71 joining the extension 70 with the leads 68, 69 is permitted to move toward the tip and terminal ends in the direction of arrow E (FIG. 8). Such movement creates "slack" to permit the lead element 60 to bend with a minimum of twisting, as shown in FIG. 8.

The lead element 60 provides redundant electrical paths through most of its length, although the extension portion 70 has no redundancy. The extension portion 70 may be enlarged in width in order to reduce the likelihood of failure in that region, counteracting the lack of redundancy.

The parallel curved lead 68, 69 surrounding the lead element 60 reduce the self-inductance of the lead. Further, because generous radii are provided at all flex points, and because twisting of the lead is minimized by placement of the extension portion 70, the lead undergoes relatively low localized stress during extension. The extension of the lead in the Z direction is approximately 80% of the pitch of the corresponding grid array.

Figure 9:
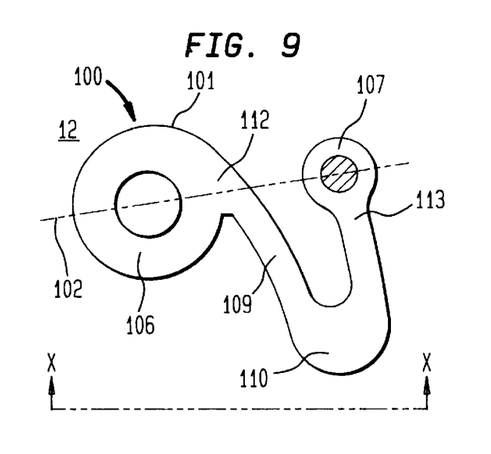
FIG. 9 is a plan view of a lead element according to another embodiment of the invention.
Figure 10:
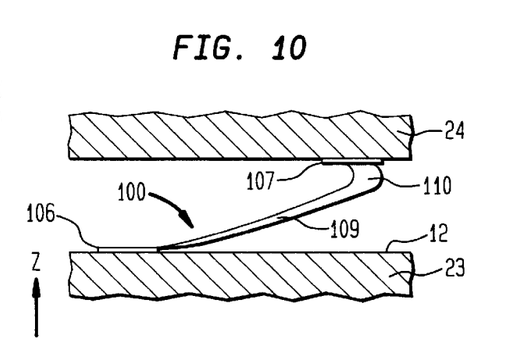
FIG. 10 is an idealized side view of the lead element of FIG. 9, in the direction of arrow X—X, shown in an expanded state.

Lead element 100 (FIG. 9), another embodiment of the invention, has a curved lead 109 interconnecting a terminal end 106, for connecting to a first microelectronic element, and a tip end 107, for connecting to a second microelectronic element. The terminal end 106 is disposed on a lead bearing surface 12 and the tip end 107 is spaced apart from the terminal end 106 and is releasably connected to the lead bearing surface 12. In a preferred embodiment, the tip and terminal ends are spaced apart less than 500 microns, and are most preferably spaced apart approximately 250 microns. One end of the lead, preferably the terminal end, comprises a bulge 101. The curved lead 109 is substantially tangent to the bulge at tangency point 112. The centers of the terminal end and the tip end 106, 107 define an offset axis 102 along which the ends are offset from each other. A major portion of the length of the lead 109 is a U-shaped bight 110 on one side of the offset axis 102. The U-shaped bight 110 provides the slack required for the lead element 100 to compensate for the increased distance between the terminal and tip ends 106, 107 during expansion of the lead in the Z direction (FIG. 10).

The point of tangency 112 between the lead 109 and the bulge 101 lies substantially along the offset axis 102. The lead 109 joins the tip end 107 at junction 113 in a direction transverse to the offset axis 102. The tangential junction of the lead 109 with the bulge 101 is thought to permit some twisting of the lead as it enters the bight 110. That twisting permits the bight 110 to flex without undue stress, allowing an increase in a straight-line distance between the tip and terminal ends 106, 107 during extension of the lead element in the Z direction.

Because the bight 110 provides a large amount of slack in the lead element 100, the lead element is capable of extending about 130% of the pitch of a corresponding grid array. The single-conductor lead, however, is believed to have increased self-inductance and relatively high stress near the edges of the bulge during a large extension of the lead.

Lead 120 (FIG. 11) comprises a generally S-shaped lead 129 interconnecting a tip end 127 and a terminal end 126 spaced less than approximately 500 microns in a preferred embodiment, and are most preferably about 250 microns apart. The S-shaped lead has a first curve 130 in a counter-clockwise, or first, direction, and a second curve 131 in a clockwise, or second, direction. Each curve has a curve angle defined by the angle of rotation B through which a vector $V_1$, tangent to the lead 129 entering the curve, must be rotated to point in the direction of a vector $V_2$, tangent to the lead as it exits the curve. In a preferred embodiment, the curve angle of at least one of the leads should be at least 90 degrees. By providing at least one large curve angle on the S-shaped lead, a large amount of slack is provided in the lead to compensate for the increase in the straight-line distance between the tip and terminal ends during expansion in the Z direction. In a preferred embodiment, both curves 130, 131 have curve angles greater than 90 degrees, providing additional slack for lead expansion.

Figure 11:
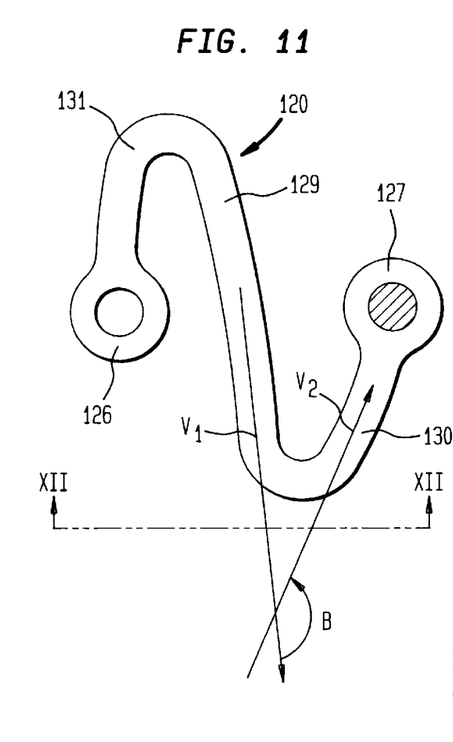
FIG. 11 is a plan view of a lead element according to another embodiment of the invention.

The central portion of the lead 120 between the curves 130, 131 may have an increased thickness (not shown) in order to control the lead shape and flexing points during and after expansion in the Z-direction. The increased thickness may taper from a thick point at the center to thinner portions near the curves.

Figure 12:
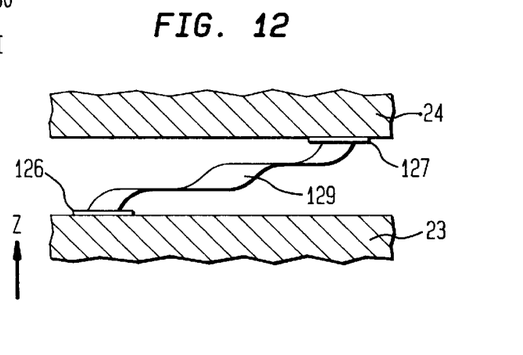
FIG. 12 is an idealized side view of the lead element of FIG. 11, in the direction of arrow XII—XII, shown in an expanded state.

As the lead element 120 expands in the Z direction (FIG. 12), the curved lead 129 twists in response to the increase in distance between the ends 126, 127. Because of the relatively large curve angles, the lead 120 may be capable of expansion in excess of 130% of the pitch of a corresponding grid array. Because the lead has a single conductor, however, it is subject to self-inductance; because of twisting along its length, the lead has stress points near the tip and terminal ends.

Figure 13:
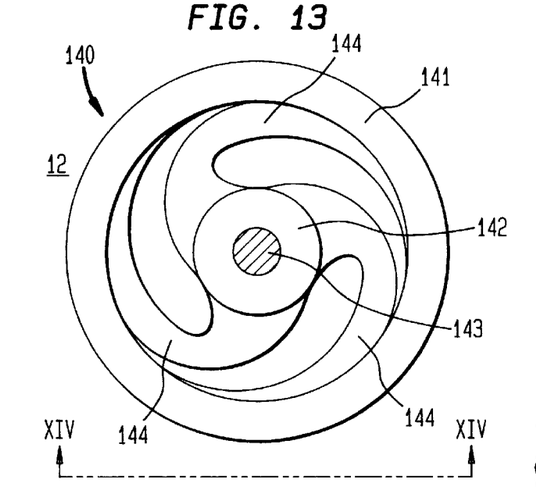
FIG. 13 is a plan view of a lead element according to another embodiment of the invention.
Figure 14:
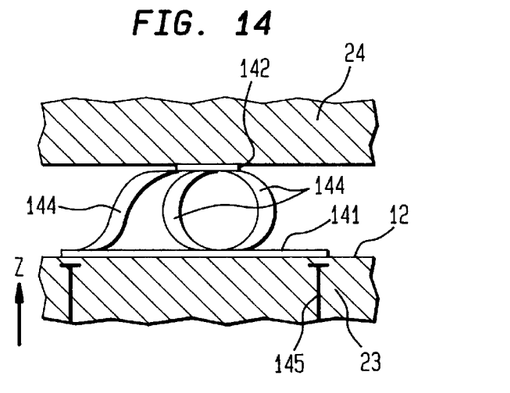
FIG. 14 is an idealized side view of the lead element of FIG. 13, in the direction of arrow XIV—XIV, shown in an expanded state.

Lead element 140 (FIG. 13) has a central tip end 142 for connection to a second microelectronic element 24 (FIG. 14). Surrounding the tip end is an annular terminal structure 141 connected to the lead bearing surface 12. The annular terminal structure is for connection to a first microelectronic element 23. The annular terminal structure 141 may overlie the first microelectronic element through one or more individual contacts 145 in the first microelectronic element. In the case where a conductive via (not shown) in the element 23 connects to the annular terminal structure 41, the lead should be disposed on a conductive pad (not shown) connecting the lead with the via, and providing additional structural support for the annular ring. The outside diameter of the lead element may be below 500 microns, and preferably is about 200 microns.

Interconnecting the annular terminal structure 141 and the central tip end 142 is a plurality of leads 144. Each lead may be an elongated spiral extending from the central tip end in a cycloid or other curve wherein the radius of curvature increases as the lead extends outward from the central tip end.

In a preferred embodiment, three such spiral leads extend from the central tip end to the annular terminal end. Because of their spiral form, the leads tend to "unwrap" as the lead element 140 is expanded in the Z direction (FIG. 14), exerting torque on the tip and terminal ends. Because the tip and terminal ends are not permitted to twist with respect to each other, the leads twist as they are expanded, permitting straight-line movement between the tip end and the terminal end.

In an alternative construction of the lead 140, the central tip end may be connected to a lead-bearing surface on the first microelectronic element, while the annular terminal structure is attached to a contact on the second microelectronic element. In that case, the contact on the second microelectronic element should be as large or larger than the annular terminal structure.

Lead 140 may be extended to approximately 43% of the pitch of a corresponding grid array. The multiple, parallel conductors provide a lead with relatively low self-inductance. Further, the redundant leads increase reliability of the overall lead element. The lead, however, has localized stress points created by the torque exerted on the tip and terminal ends during expansion, and requires relatively high-resolution lithography in order to form the required geometry.

Figure 15:
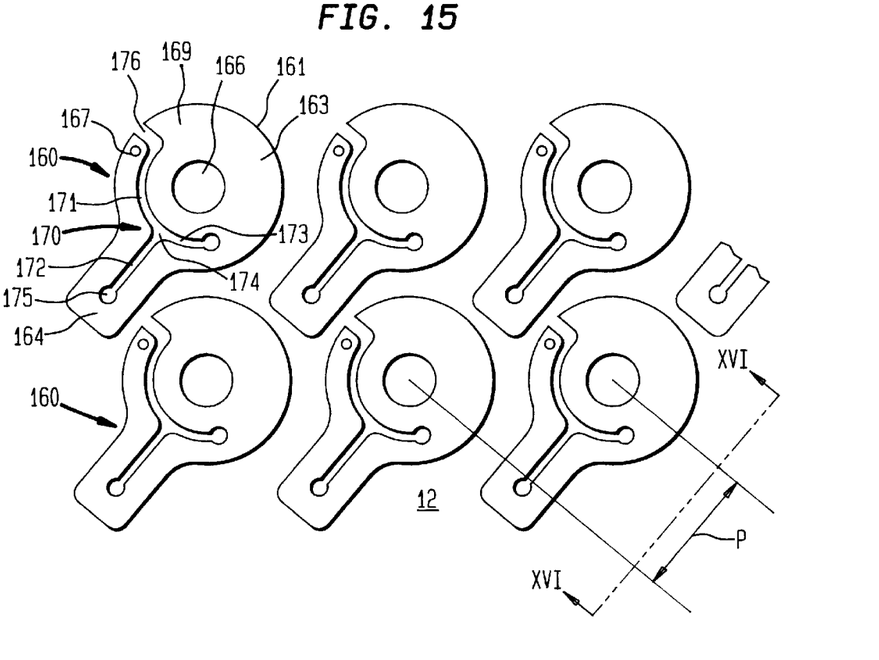
FIG. 15 is a partial plan view of an array of lead elements according to another embodiment of the invention.
Figure 16:
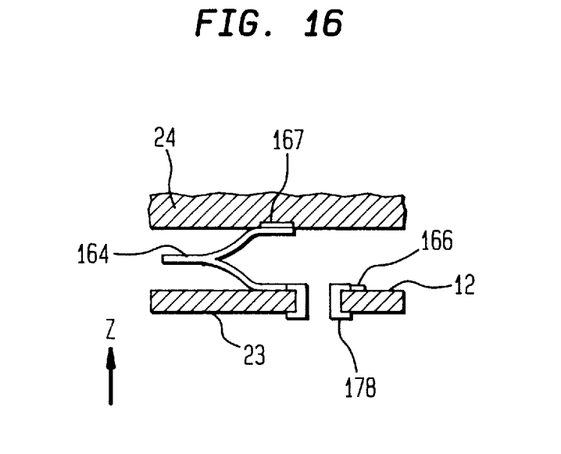
FIG. 16 is a diagrammatic side view of one of the lead elements of FIG. 17, in a direction of arrow XVI—XVI, shown in an expanded state.

In a further embodiment of an invention, a lead element 160 (FIG. 15) comprises a sheet-like lead 169 interconnecting a terminal end 166 and a tip end 167. The sheet-like lead is bounded by a peripheral edge 161, and is formed on a lead bearing surface 12. The sheet-like lead 169 defines a slot 170 having a plurality of branches. A first branch 171 passes between the terminal end 166 and the tip end 167, and has an opening 176 at the peripheral edge 161 of the lead. The opening of the first branch 171 at the peripheral edge permits the sheet-like lead 169 to expand as the tip end 167 is vertically extended from the lead bearing surface 12 (FIG. 16).

In a preferred embodiment, the slot is Y-shaped, having a second branch 172 and a third branch 173 joining at a branch junction 174. One or more of the slots may have a rounded cutout 175 having a diameter larger than the slot width, in order to reduce stress risers at the terminal end of the slot.

The sheet-like lead 169 may have a bulbous portion 163 and an elongated portion 164 extending from the bulbous portion. The terminal end lies substantially at the center of the bulbous portion while the tip end is in a peripheral region of the bulbous portion. The second branch 172 of the slot extends longitudinally within the elongated portion of the lead. The second branch 172 terminates in a rounded cutout 175 sufficiently distant from the end of the elongated portion 164 to provide a lead width having strength comparable to other portions of the lead.

A third branch 173 of the slot 170 joins the first and second branches 171, 172 at a branch junction 174. The branch junction is located near where the elongated portion of the lead meets the bulbous portion. The first branch 171 and third branch 173 partially surround the terminal end 166, forming an arc that is inset from the peripheral edge 161 a sufficient distance to form lead segments outside the branches having sufficient width. The third branch 173 also terminates in a rounded cutout for stress relief.

The branched slot 170 forms a meandering lead element that "unfolds" as the first and second microelectronic elements 23, 24 are displaced in a Z direction (FIG. 16). The distal end of the elongated portion 164 is free to move horizontally toward the tip and terminal ends during vertical extension, reducing twisting in the element.

Figure 17:
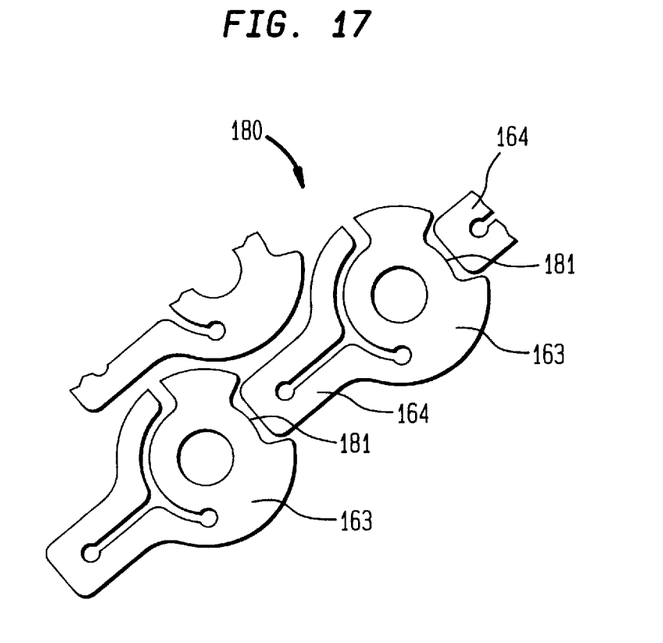
FIG. 17 is a partial plan view of an array of lead elements according to another embodiment of the invention.

The overall shape of the sheet-like leads 169, including the bulbous and elongated portions, permits the formation of a tightly packed grid array, as shown in FIG. 15. The lead density within an array may be further increased by providing a clearance cutout 181 (FIG. 17) in the bulbous portion 163 of a lead element 180, for clearing the elongated portion 164 of a neighboring lead. In a preferred embodiment, the grid array may have a pitch P of approximately 250 microns or less, and more preferably approximately 125 microns. High lead density, in combination with the meandering lead element formed by the branched slot 170, yields a lead element having a large vertical extension in proportion to the pitch of a corresponding grid array. It is believed that this lead configuration provides an extension of approximately 150 percent or more of the pitch of a corresponding grid array.

The bulbous portion 163 provides sufficient area around the terminal end 166 to attach the sheet-like lead 169 to the first microelectronic element 23 using connectors such as via 178 (FIG. 16). In that case, the first microelectronic element 23 is a sheet-like connector element.

The lead elements, configurations and other aspects of the invention discussed herein may be used in various configurations discussed in U.S. Pat. No. 5,518,964. Merely by way of example, the present invention may be utilized in conjunction with an entire semi-conductor wafer, or in the assembly of plural chips, or in conjunction with a single chip, all as described in the '964 patent. The present invention may also be utilized in conjunction with the inventions disclosed in U.S. patent application Ser. No. 08/532,528 filed Sep. 22, 1995, application Ser. No. 08/678,808 filed Jul. 12, 1996, and application Ser. No. 08/653,016 filed May 24, 1996, the disclosures of which are hereby incorporated by reference herein.

Although the invention herein has been described with reference to particular embodiments, it is to be understood that these embodiments are merely illustrative of the principles and applications of the present invention. It is therefore to be understood that numerous modifications may be made to the illustrative embodiments and other arrangements may be devised without departing from the spirit and scope of the present invention as defined by the appended claims.

We claim:

1. A microelectronic lead assembly for connecting first and second microelectronic elements, said lead assembly comprising:
   a structure defining a lead-bearing surface;
   a terminal end for connection to the first microelectronic element, said terminal end disposed on said lead-bearing surface and fixed to said structure;
   a tip end for connection to the second microelectronic element, said tip end being releasably connected to said lead-bearing surface and spaced apart on said lead-bearing surface from said terminal end on an offset axis;
   a first curved lead interconnecting said tip end and said terminal end; and
   a second curved lead interconnecting said tip end and said terminal end.

2. A microelectronic lead assembly as claimed in claim 1, wherein said first and second curved leads are arranged on opposite sides of said offset axis.

3. A microelectronic lead assembly as claimed in claim 2, wherein first and second curved leads are substantially symmetric across said offset axis.

4. A microelectronic lead assembly as claimed in claim 1 wherein said first and second curved leads join said terminal end from substantially opposite directions.

5. A microelectronic lead assembly as claimed in claim 1, wherein said first and second curved leads join each of said ends from substantially opposite directions.

6. A microelectronic lead assembly as claimed in claim 1 wherein said first and second curved leads bow away from the offset axis and away from one another between said tip end and said terminal end.

7. A microelectronic lead assembly as claimed in claim 1 wherein said terminal end includes a bulge and wherein first and second curved leads have tapered portions adjacent the terminal end, said leads gradually increasing in width in the directions along said curved leads toward said terminal end.

8. A microelectronic lead assembly as claimed in claim 1 wherein said structure defining a lead-bearing surface is a flexible, sheet-like structure and said terminal end is fixed to a via extending through said structure.

9. A microelectronic lead assembly as claimed in claim 1, further comprising an extension portion extending substantially along said offset axis and having first and second ends, said extension portion being connected at said first end to one of said tip end and said terminal end, and connected at said other end to said first and second curved leads.

10. A microelectronic lead assembly as claimed in claim 9, wherein said extension portion extends from said one of said ends in a direction away from the other of said ends.

11. A microelectronic lead assembly as claimed in claim 9, wherein said extension portion extends from said terminal end.

12. A microelectronic lead assembly as claimed in claim 9 wherein said structure defining a lead-bearing surface is a flexible, sheet-like structure and said terminal end is fixed to a via extending through said structure.

13. A microelectronic lead assembly for connecting first and second microelectronic elements, said lead assembly comprising:
   a structure defining a lead-bearing surface;
   a terminal end for connection to the first microelectronic element, said terminal end disposed on said lead-bearing surface and fixed to said structure;
   a tip end for connection to the second microelectronic element, said tip end being releasably connected to said lead-bearing surface, said tip end further being spaced apart on said lead-bearing surface from said terminal end; and
   a curved lead connecting said tip end and said terminal end, said curved lead having a bulge at one of said ends, said lead being substantially tangent to said bulge.

14. A microelectronic lead assembly as claimed in claim 13, wherein said ends of said lead define an offset axis, and a point of tangency between said lead and said bulge lies substantially on said offset axis.

15. A microelectronic lead assembly as claimed in claim 14, wherein said point of tangency is on a side of said bulge facing another end of said lead.

16. A microelectronic lead assembly as claimed in claim 13, wherein said one end having said bulge is said terminal end.

17. A microelectronic lead assembly as claimed in claim 13, wherein a major portion of a length of said lead is a U-shaped bight on one side of said offset axis.

18. A microelectronic lead assembly as claimed in claim 13 wherein said structure defining a lead-bearing surface is a flexible, sheet-like structure and said terminal end is fixed to a via extending through said structure.

19. A microelectronic lead assembly for connecting first and second microelectronic elements, said lead assembly comprising:
   a structure defining a lead-bearing surface;
   a terminal end for connection to the first microelectronic element, said terminal end disposed on said lead-bearing surface and fixed to said structure;
   a tip end for connection to the second microelectronic element, said tip end being releasably connected to said lead-bearing surface, said tip end also being spaced apart on said lead-bearing surface from said terminal end along an offset axis;
   a generally S-shaped lead connecting said tip end and said terminal end, said S-shaped lead having a first curve in a first direction and a second curve in a second direction opposite said first direction, said first curve having a curve angle of at least 90 degrees as measured by an angle that a vector tangent to the lead entering the curve must be rotated to have a direction of a vector tangent to the lead exiting the curve.

20. A microelectronic lead assembly as claimed in claim 19, wherein said second curve has a curve angle of at least 90 degrees.

21. A microelectronic lead assembly as claimed in claim 19 wherein said structure defining a lead-bearing surface is a flexible, sheet-like structure and said terminal end is fixed to a via extending through said structure.

22. A microelectronic lead assembly for connecting first and second microelectronic elements, said lead assembly comprising:
   a structure defining a lead-bearing surface;
   a tip end for connection to the second microelectronic element, said tip end being releasably connected to said lead-bearing surface;
   an annular terminal structure for connection to the first microelectronic element, said terminal structure disposed on said lead-bearing surface surrounding and substantially concentric with said tip end and fixed to said structure;
   a plurality of leads interconnecting said tip end and said terminal structure.

23. A microelectronic lead assembly as claimed in claim 22, wherein said plurality of leads comprises a plurality of elongated, spiral leads.

24. A microelectronic lead assembly as claimed in claim 22, wherein said plurality of leads comprises three leads.

25. A microelectronic lead assembly as claimed in claim 22 wherein said structure defining a lead-bearing surface is a flexible, sheet-like structure and said terminal end is fixed to a via extending through said structure.

26. A microelectronic lead assembly for connecting first and second microelectronic elements, said lead assembly comprising:
   a structure defining a lead-bearing surface;
   a terminal end for connection to the first microelectronic element, said terminal end disposed on said lead-bearing surface and fixed to said structure;
   a tip end for connection to the second microelectronic element, said tip end being releasably connected to said lead-bearing surface; and
   a lead interconnecting said tip end and said terminal end, said sheet-like lead having a peripheral edge and defining a slot with a plurality of branches, a first one of said branches passing between said tip end and said terminal end and having an opening at said peripheral edge.

27. A microelectronic lead assembly as claimed in claim 26, wherein said slot is generally Y-shaped, having second and third branches joining said first branch at a junction.

28. A microelectronic lead assembly as claimed in claim 26, wherein said lead element comprises an elongated portion extending from a bulbous portion, said slot having a second branch extending longitudinally along a portion of said elongated portion.

29. A microelectronic lead assembly as claimed in claim 28, wherein one of said tip end and said terminal end is positioned at a center of said bulbous portion, and the other of said tip end and said terminal end is positioned at a peripheral portion of said bulbous portion.

30. A microelectronic lead assembly as claimed in claim 29, wherein said lead element further defines a third branch of said slot connected to said first and second branches, said first and third branches extending within said bulbous portion partially around said center.

31. A microelectronic lead assembly as claimed in claim 28, wherein said bulbous portion has a clearance cutout for clearing an elongated portion of a neighboring lead.

32. A microelectronic lead assembly as claimed in claim 26, wherein at least one of said plurality of branches has a rounded cutout at a terminus thereof.

33. A microelectronic assembly including first and second microelectronic elements having confronting surfaces spaced apart from one another in a vertical direction, and a plurality of vertically extensive microelectronic lead assemblies as claimed in any one of claims 1, 13, 19, 22, or 26 interconnecting said electrical connections on said microelectronic elements.

34. A microelectronic assembly including first and second microelectronic elements having confronting surfaces spaced apart from one another in a vertical direction, a plurality of electrical connections on said microelectronic elements and a plurality of vertically extensive flexible lead elements interconnecting said electrical connections on said microelectronic elements, each said flexible lead element including a plurality of curved conductors electrically connected in parallel with one another.

35. A microelectronic assembly as claimed in claim 34, wherein said electrical connections on said microelectronic elements are arranged in a grid array.

36. A microelectronic assembly as claimed in claim 35, wherein said grid array has a pitch of less than about 1 mm.

37. A microelectronic assembly as claimed in claim 34, further comprising a compliant layer interposed between said confronting surfaces and surrounding said flexible lead elements.

38. A microelectronic assembly as claimed in claim 34, wherein said plurality of curved leads comprises a pair of curved leads.

39. A microelectronic assembly as claimed in claim 38, wherein said pair of curved conductors are arranged symmetrically about an axis.

40. A microelectronic assembly as claimed in claim 34, wherein one of said first and second microelectronic elements is a flexible, sheet-like structure, and said electrical connections between said sheet-like structure and said plurality of leads are vias extending through said structure.

* * * * *